United States Patent
Komatani

(10) Patent No.: US 9,396,927 B2
(45) Date of Patent: Jul. 19, 2016

(54) METHOD FOR FABRICATING SEMICONDUCTOR DEVICE

(71) Applicant: SUMITOMO ELECTRIC DEVICE INNOVATIONS, INC., Yokohama-shi, Kanagawa (JP)

(72) Inventor: Tsutomu Komatani, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 14/102,639

(22) Filed: Dec. 11, 2013

(65) Prior Publication Data
US 2014/0179078 A1 Jun. 26, 2014

(30) Foreign Application Priority Data
Dec. 21, 2012 (JP) .................. 2012-279752

(51) Int. Cl.
| H01L 21/28 | (2006.01) |
| H01L 21/02 | (2006.01) |
| H01L 21/3105 | (2006.01) |
| H01L 21/3115 | (2006.01) |
| H01L 29/66 | (2006.01) |
| H01L 29/778 | (2006.01) |
| H01L 21/285 | (2006.01) |
| H01L 29/20 | (2006.01) |

(52) U.S. Cl.
CPC ........ *H01L 21/0217* (2013.01); *H01L 21/0234* (2013.01); *H01L 21/02211* (2013.01); *H01L 21/02274* (2013.01); *H01L 21/02326* (2013.01); *H01L 21/02329* (2013.01); *H01L 21/3105* (2013.01); *H01L 21/31155* (2013.01); *H01L 29/66462* (2013.01); *H01L 29/7787* (2013.01); *H01L 21/28587* (2013.01); *H01L 29/2003* (2013.01)

(58) Field of Classification Search
CPC ................... H01L 21/02247; H01L 21/02252; H01L 21/02255
USPC .......................................... 438/602, 604–605
See application file for complete search history.

(56) References Cited

U.S. PATENT DOCUMENTS

| 8,213,751 | B1 * | 7/2012 | Ho .......................... G02B 6/305 385/1 |
| 2006/0220063 | A1 | 10/2006 | Kurachi et al. |
| 2008/0203541 | A1 * | 8/2008 | Makiyama .................... 257/640 |
| 2011/0121313 | A1 * | 5/2011 | Briere ............................. 257/76 |
| 2012/0028423 | A1 * | 2/2012 | Araya et al. .................. 438/191 |
| 2014/0197460 | A1 * | 7/2014 | Makiyama .................... 257/194 |

FOREIGN PATENT DOCUMENTS

JP  2006278812 A  10/2006

* cited by examiner

*Primary Examiner* — H Tsai
(74) *Attorney, Agent, or Firm* — Westerman, Hattori, Daniels & Adrian, LLP

(57) ABSTRACT

A method for fabricating a semiconductor device includes: forming a silicon nitride film having a refractive index equal to or larger than 2.2 on a nitride semiconductor layer; and introducing at least one of elements that are oxygen, nitrogen, fluorine, phosphorus, sulfur and selenium into the silicon nitride film, the silicon nitride film including the at least one of elements remaining on the nitride semiconductor layer. The at least one of elements is introduced by a process of exposing the silicon nitride film to plasma including the at least one of elements, a process of ion-implanting the at least one of elements into the silicon nitride film, or a process of thermally diffusing the at least one of elements into the silicon nitride film. The silicon nitride film is formed in contact with a surface of the nitride semiconductor layer.

9 Claims, 14 Drawing Sheets

METHOD FOR FABRICATING SEMICONDUCTOR DEVICE

CROSS-REFERENCE TO RELATED APPLICATION

This application is based upon and claims the benefit of priority of the prior Japanese Patent Application No. 2012-279752, filed on Dec. 21, 2012, the entire contents of which are incorporated herein by reference.

BACKGROUND (i) Technical Field

The present invention relates to methods for fabricating semiconductor devices, and more particularly, to a method for fabricating a semiconductor device having a silicon nitride film formed on a nitride semiconductor layer.

(ii) Related Art

Semiconductor devices using nitride semiconductors are used in, for example, power devices capable of operating at high frequencies and outputting high power. Particularly, FETs (Field Effect Transistors) such as HEMT (High Electron Mobility Transistor) are known as transistors suitable for amplifying in high-frequency or RF bands, which may include microwaves, quasi-millimeter waves, or millimeter waves.

It is known to form a silicon-rich silicon nitride film formed on a nitride semiconductor layer in order to suppress the collapse phenomenon of the drain current (see Japanese Patent Application Publication No. 2006-278812.

However, a high composition ratio of silicon in the silicon-rich silicon nitride film results in a drift of the drain current.

SUMMARY

According to an aspect of the present invention, the drift of the drain current is suppressed.

According to another aspect of the present invention, there is provided a method for fabricating a semiconductor device comprising: forming a silicon nitride film having a refractive index equal to or larger than 2.2 on a nitride semiconductor layer; and introducing at least one of elements that are oxygen, nitrogen, fluorine, phosphorus, sulfur and selenium into the silicon nitride film, the silicon nitride film including the at least one of elements remaining on the nitride semiconductor layer, the at least one of elements being introduced by one of a process of exposing the silicon nitride film to plasma including the at least one of elements, a process of ion-implanting the at least one of elements into the silicon nitride film, and a process of thermally diffusing the at least one of elements into the silicon nitride film, and the silicon nitride film being formed in contact with a surface of the nitride semiconductor layer.

DETAILED DESCRIPTION

Exemplary embodiments of the present invention are now described with reference to the accompanying drawings.

Figure 1A:
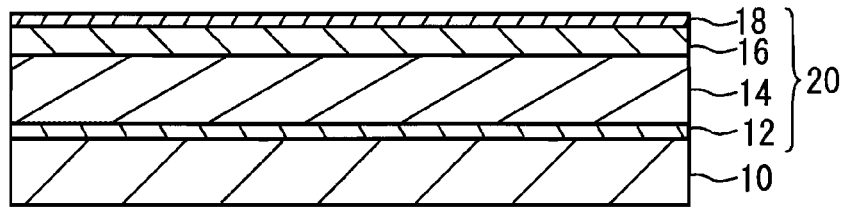
FIGS. 1A through 1D are cross-sectional views that illustrate a method for fabricating a semiconductor device in accordance with a first embodiment.

FIGS. 1A through 1D and FIGS. 2A through 2D are cross-sectional views of a method for fabricating a semiconductor device in accordance with a first embodiment. Referring to FIG. 1A, a nitride semiconductor layer 20 is grown on a substrate 10 by a MOCVD (Metal Organic Chemical Vapor Deposition) method. The substrate 10 is, for example, a SiC substrate having the (0001) main surface. The stacking direction of the nitride semiconductor layer 20 is the [0024] direction, for example. The nitride semiconductor layer 20 includes a nucleation layer 12, a channel layer 14, an electron supply layer 16 and a cap layer 18, which are stacked in this order from the substrate 10 side. The nucleation layer 12 is an aluminum nitride (AlN) layer having a thickness of 300 nm, for example. The channel layer 14 is a non-doped gallium nitride (GaN) layer having a thickness of 1000 nm, for example. The electron supply layer 16 is an n-type aluminum gallium nitride (AlGaN) layer having a thickness of 20 nm, for example. The cap layer 18 is an n-type gallium nitride layer having a thickness of 5 nm.

Figure 1B:
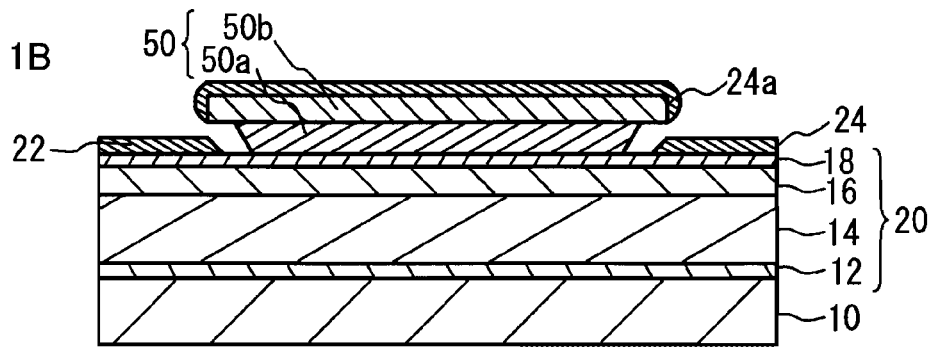

Referring to FIG. 1B, a photoresist 50, which has a lower layer 50a and an upper layer 50b, is coated on the nitride semiconductor layer 20. An opening is formed in the photoresist 50 by an exposure and development process. Then, a source electrode 22 and a drain electrode 24 are formed on the nitride semiconductor layer 20 by an evaporation method. Each of the source electrode 22 and the drain electrode 24 includes a titanium (Ti) film and an aluminum (Al) film stacked in this order from the nitride semiconductor layer 20. For example, the Ti film is 30 nm thick, and the Al film is 300 nm thick. The Ti film may be replaced by a Ta film. After that, the photoresist 50 is removed so that a metal 24a is removed. Through the above process, the source electrode 22 and the drain electrode 24 are defined on the nitride semiconductor layer 20. The source electrode 22 and the drain electrode 24 are alloyed with the nitride semiconductor layer 20 by annealing at 550° C., for example.

Figure 1C:
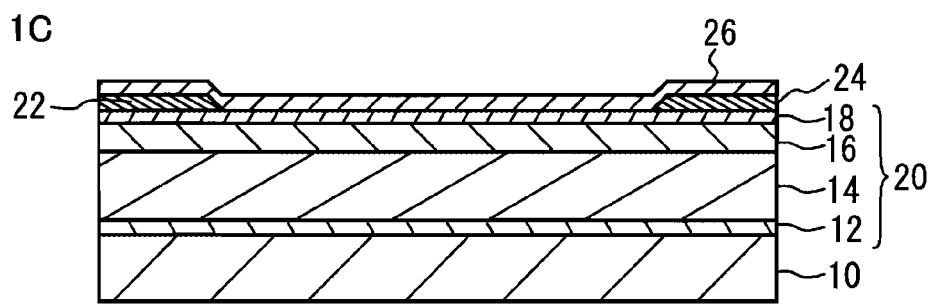

Referring to FIG. 1C, a silicon nitride film 26 is deposited on the nitride semiconductor layer 20 by a plasma CVD method. The following are exemplary conditions for depositing the silicon nitride film 26.

Apparatus for film deposit: parallel plate type plasma CVD
Substrate temperature: 250° C.
Gas: $SiH_4$, $NH_3$, $N_2$, He
Gas flow rate: $SiH_4$: 4 sccm, $NH_3$: 2 sccm, $N_2$: 200 sccm, He: 800 sccm
Pressure: 1.0 Torr
Power: 75 Watts
Film thickness: 20 nm Under the above deposit conditions, the silicon nitride film 26 has a refractive index of approximately 2.35.

Figure 1D:
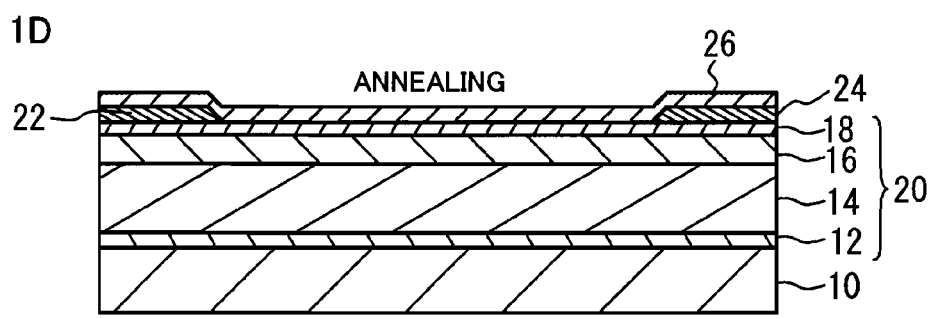

Referring to FIG. 1D, the surface of the silicon nitride 26 is annealed. For example, the anneal temperature is 400° C. and the annealing time is 5 minutes.

Figure 2A:
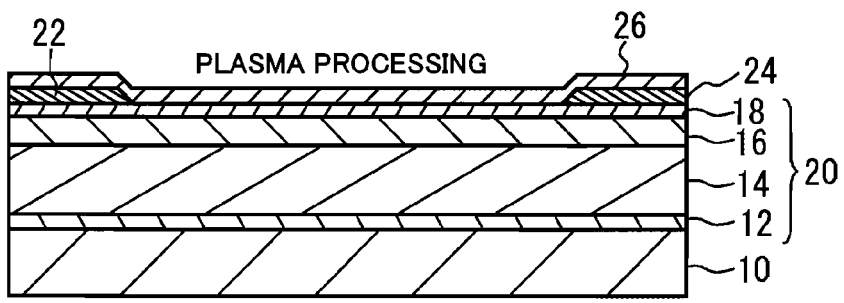
FIGS. 2A through 2D are cross-sectional views that illustrates steps following those of FIGS. 1A through 1D.
Figure 2B:
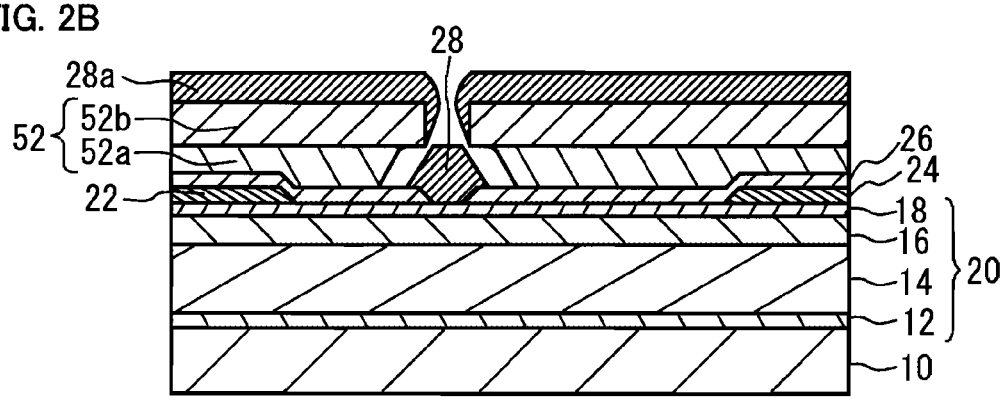

Referring to FIG. 2A, the surface of the silicon nitride film 26 is exposed to plasma. Exemplary conditions for plasma processing are as follows (plasma processing is carried out by a CCP (Capacitively Coupled Plasma) method after the silicon nitride film 26 is taken out from the apparatus for film deposit).

Processing Apparatus: parallel plate electrode structure (CCP)
Temperature: room temperature
Gas: $O_2$ or $N_2$
Gas flow rate: 100 sccm
Pressure: 0.5 Torr
Power: 100 Watts
Time: 3 minutes The following are other processing conditions.
Processing Apparatus: inductively coupled plasma (ICP)
Temperature: room temperature
Gas: $O_2$ or $N_2$
Gas flow rate: 100 sccm
Pressure: 5 Pa
ICP power: 700 Watts
Bias power: 30 Watts
Time: 3 minutes Referring to FIG. 2B, a photoresist 52 composed of a lower layer 52a and an upper layer 52b is coated on the nitride semiconductor layer 20. An opening is formed in the photoresist 52 by the exposure and development process. An opening is formed in the silicon nitride film 26 with the photoresist 52 being used as a mask. By the evaporation method, a gate electrode 28 is formed on the nitride semiconductor layer 20. The gate electrode 28 is composed of a nickel (Ni) layer and a gold (Au) layer stacked in this order from the nitride semiconductor layer 20 side. For example, the Ni film has a thickness of 50 nm, and the Au film has a thickness of 400 nm. A metal layer 28a is formed on the photoresist 52. Thereafter, the metal layer 28a is removed by removing the photoresist 52. Through the above process, the gate electrode 28 is formed on the nitride semiconductor layer 20.

Figure 2C:
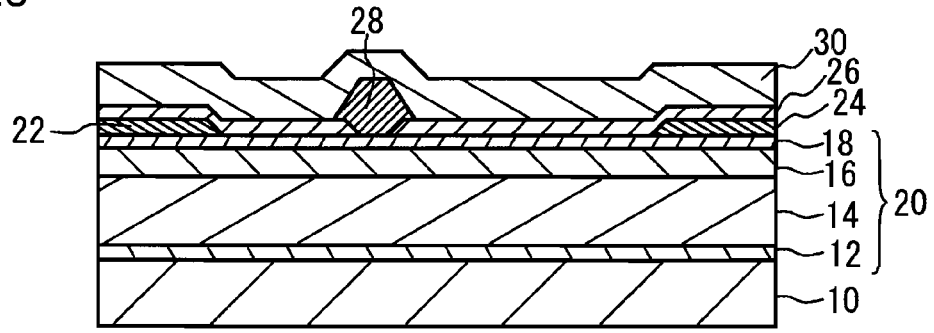

Referring to FIG. 2C, an insulating film 30 is deposited on the silicon nitride film 26 by the CVD method so as to cover the gate electrode 28. The insulating film 30 is, for example, a silicon nitride film that has a thickness of 500 nm and a refractive index smaller than 2.2 and is similar to the stoichiometric composition.

Figure 2D:
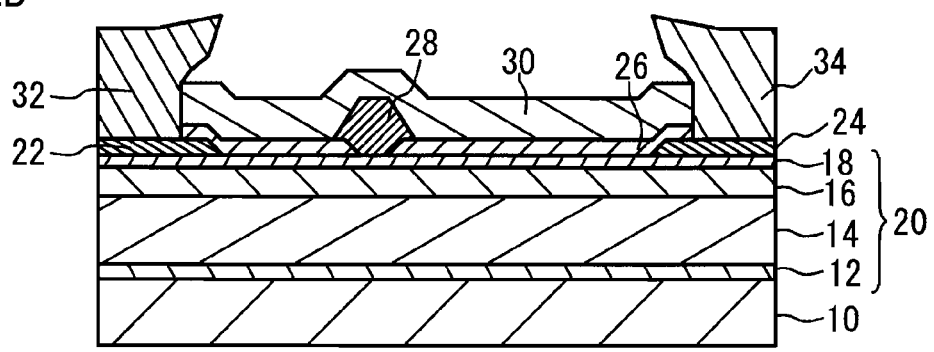

Referring to FIG. 2D, openings are formed in the insulating film 30. A source interconnection line 32 and a drain interconnection line 34, which are connected through the openings to the source electrode 22 and the drain electrode 24, respectively, are formed. The source interconnection line 32 and the drain interconnection line 34 are, for example, an Au film formed by plating.

A sample (first embodiment) using plasma processing with the CCP apparatus and $O_2$ gas as the plasma process in FIG. 2A, and another sample (first comparative example) that does not use the annealing and plasma processing were produced. The other conditions were the same as those previously described with reference to FIGS. 1A through 1D and FIGS. 2B through 2D.

Figure 3A:
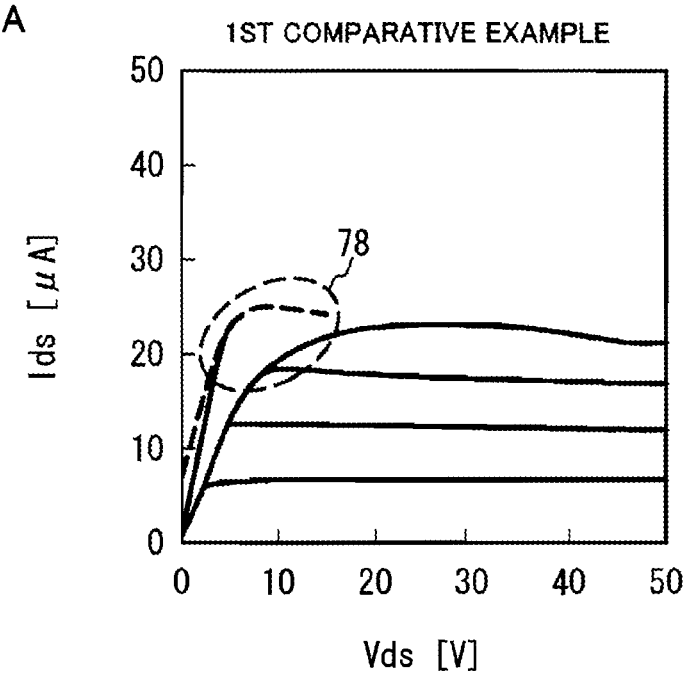
FIGS. 3A and 3B are drain current-voltage characteristics of a first comparative example and the first embodiment, respectively.
Figure 3B:
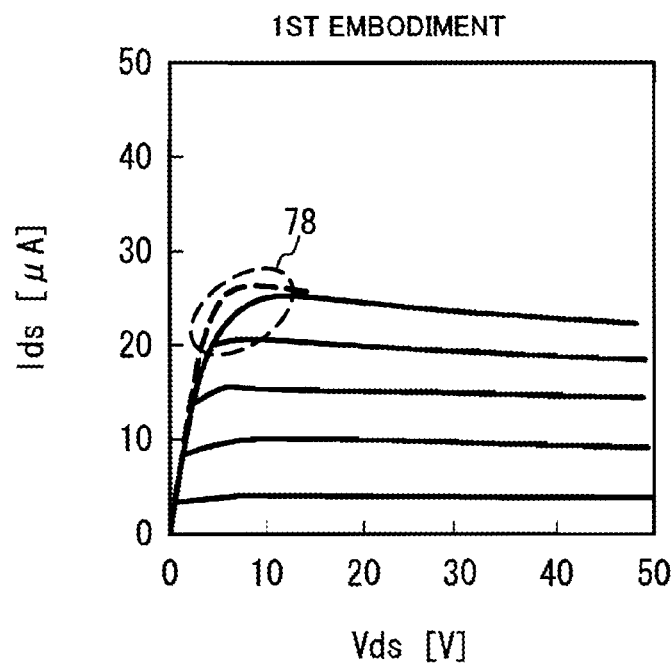

FIGS. 3A and 3B are drain current-voltage characteristics of the first comparative example and the first embodiment, respectively. Referring to FIGS. 3A and 3B, the drain current-voltage characteristics were measured by a curve tracer. The drain voltage was swept from 0 V to the maximum voltage. Broken lines indicate drain currents measured when the maximum drain voltage is 15 V and the gate voltage is 2V. Solid lines indicate drain currents measured when the maximum drain voltage is 50 V and the gate voltage is swept every 1V step from −2 V to +2 V.

As illustrated in FIG. 3A, in the first comparative example, the drain currents indicated by the solid lines within a range in which the drain voltage is low are smaller than the drain current indicated by the broken line. In contrast, as illustrated in FIG. 3B, in the first embodiment, the drain current has only a little change. The first embodiment suppresses the drain current collapse more effectively than the first comparative example.

Figure 4A:
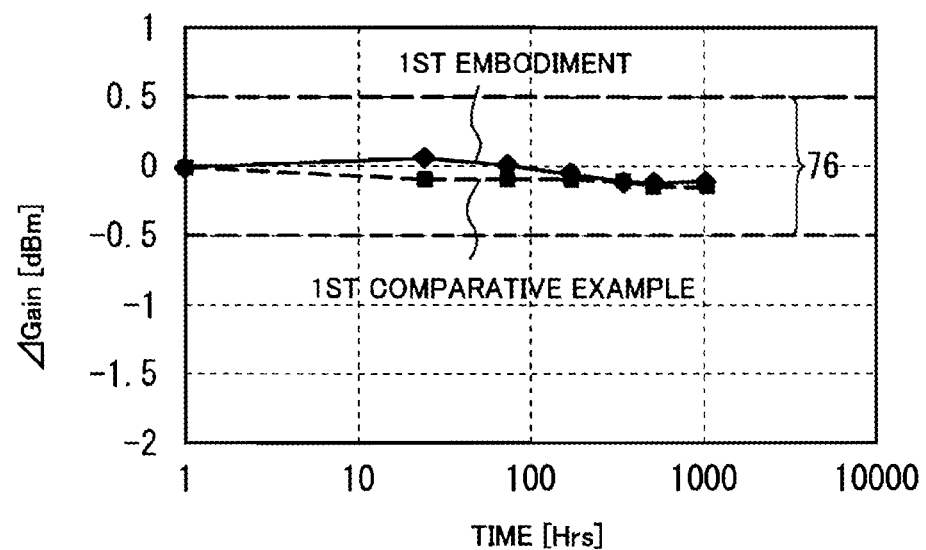
FIGS. 4A and 4B are diagrams that illustrate variations in the gain and those in the saturated power in continuous energization, respectively.
Figure 4B:
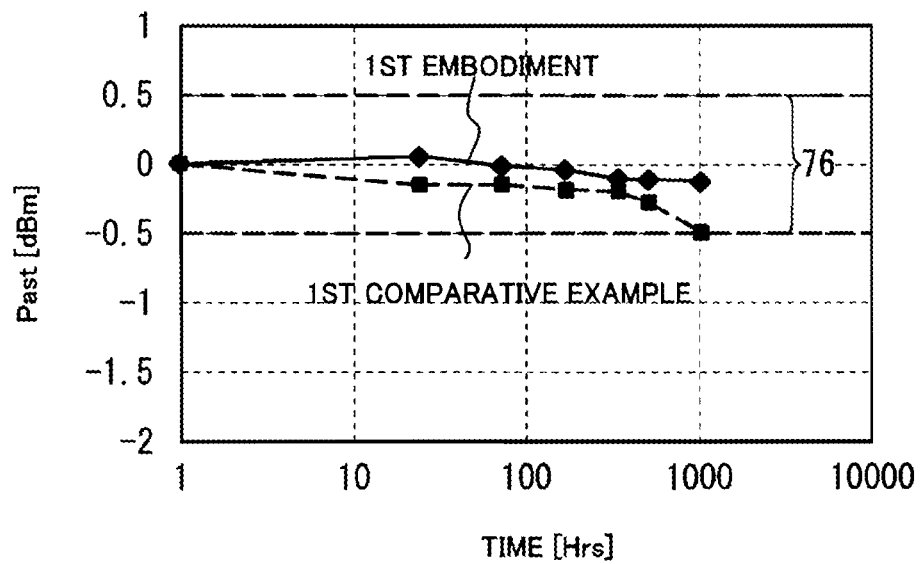

FIGS. 4A and 4B are graphs of gain variations and saturated power variations in continuous energization. The used samples have a gate width of 2.25 mm. The conditions for the continuous energization have a channel temperature of 250° C., a drain voltage of 50 V and a drain current of 100 mA. In the measurement work, the energization was interrupted, and the gain and the saturated power were measured at a frequency of 10 GHz as high RF signal. Dots indicate measured values and lines interconnect the dots. Dots at 1 hour are values measured before energization, and the other dots are values measured after energization. The vertical axes indicate differences between the measured values before energization and those after energization. Ranges 76 are standardized ranges.

As illustrated in FIG. 4A, there is no large difference in the gain between the first embodiment and the first comparative example. In contrast, as illustrated in FIG. 4B, in the first comparative example, the saturated power decreases as the energization time passes. This phenomenon relates to reduction of the drain current due to the continuous condition. In the first embodiment, the saturated power hardly changes as the energization time passes.

Figure 5A:
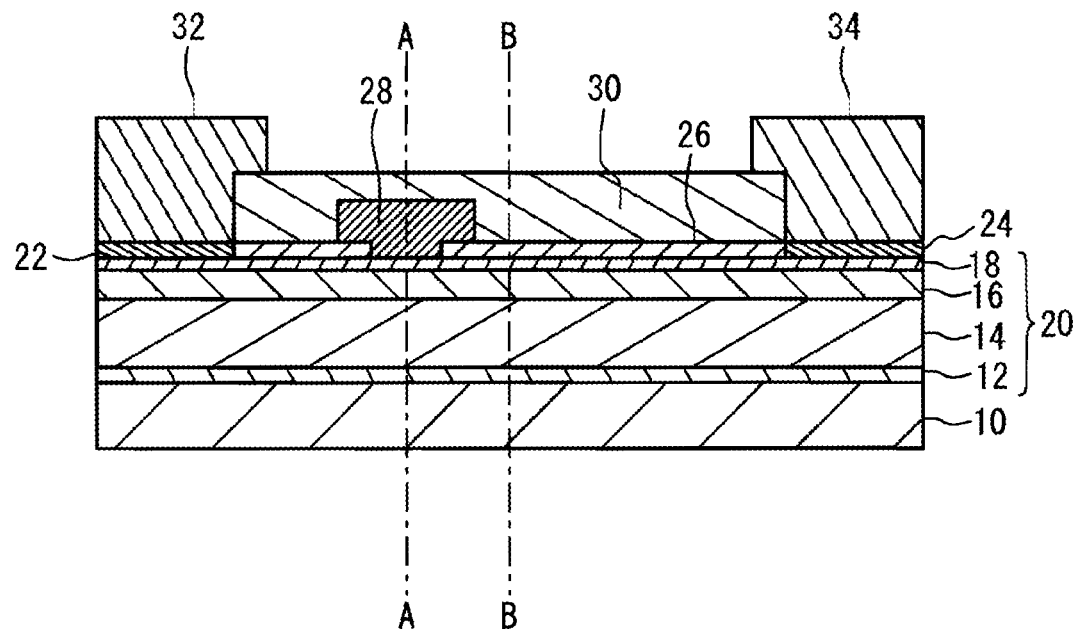
FIG. 5A is a cross-sectional view of a semiconductor device.
Figure 5B:
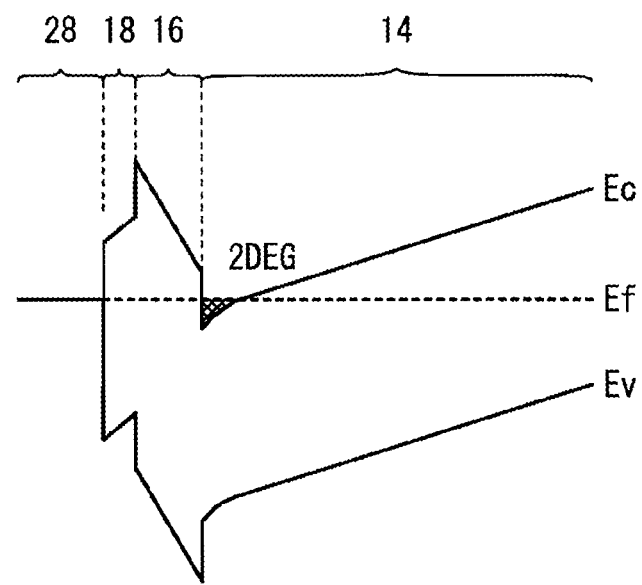
FIG. 5B is an energy band diagram along a line A-A in FIG. 5A.

Now, the reason why variations of the drain current and/or the saturated power are suppressed is considered. FIG. 5A is a cross-sectional view of a semiconductor device, and FIG. 5B is an energy band diagram along a line A-A in FIG. 5A. Referring to FIG. 5A, the semiconductor device has the same structure as that illustrated in FIG. 2D, and a description thereof is omitted here. Referring to FIG. 5B, Ec is the potential energy at the bottom of the conduction band, Ev is the potential energy at the top of the valence band, and Ef is the Fermi energy level. At the interface of the channel layer 14 with the electron supply layer 16, Ec is lower than Ef, so that two-dimensional gas 2 DEG can be generated.

Figure 6A:
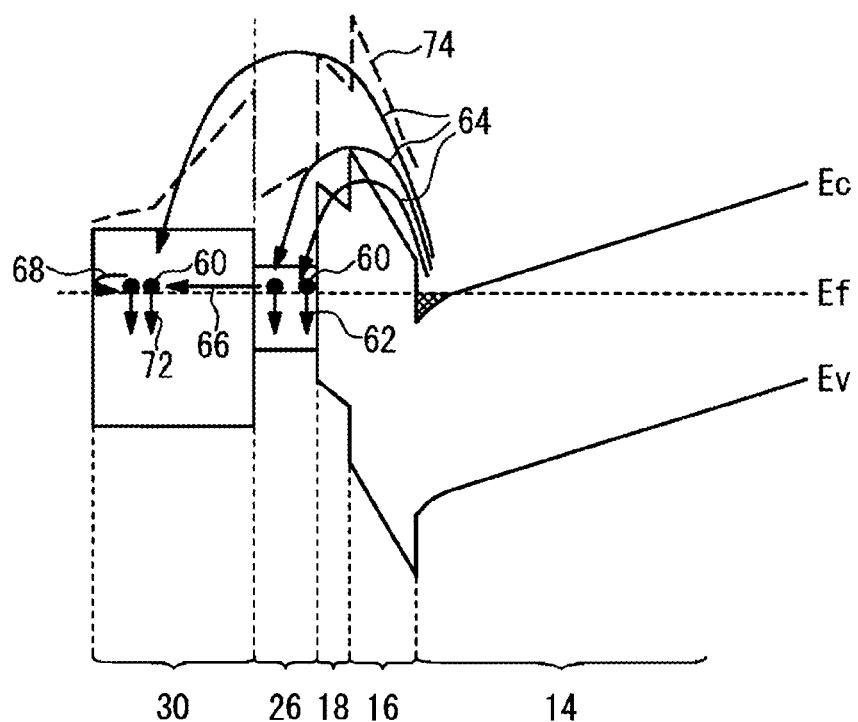
FIGS. 6A and 6B are energy band diagrams along a line B-B in FIG. 5A.
Figure 6B:
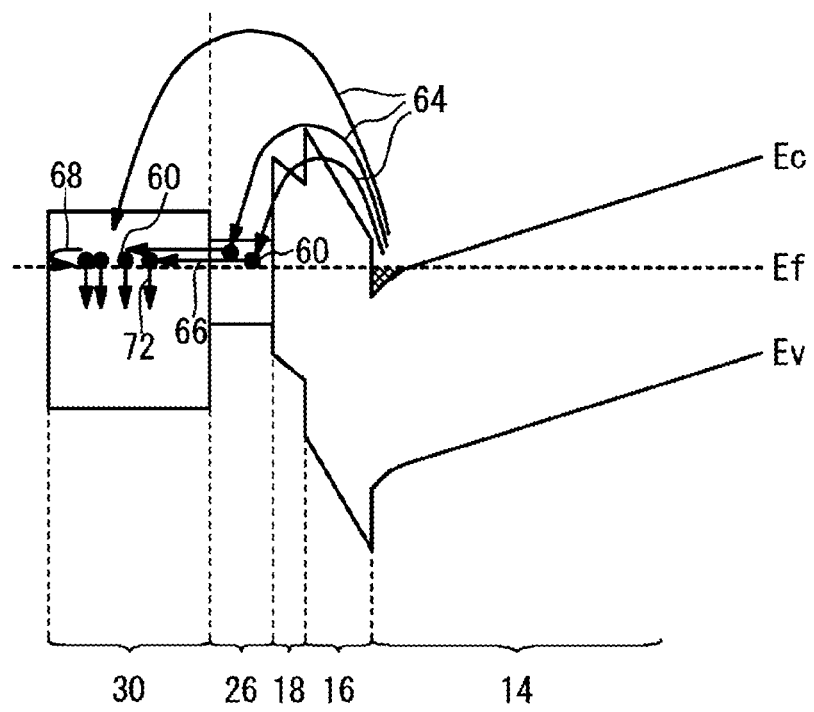

FIGS. 6A and 6B are energy band diagrams along a line B-B in FIG. 5A. The silicon-rich silicon nitride film 26 has a band gap smaller than a silicon nitride film (insulating film 30) having the stoichiometric composition.

FIG. 6A corresponds to the first comparative example. An oxide layer of a group-iiiB oxide such as gallium oxide exists on the surface of the nitride semiconductor layer 20. The oxide layer is unstable and is a cause of the collapse phenomenon and/or variation in the parasitic capacitance. The silicon-rich silicon nitride film 26 includes many active Si—H bonds. By annealing, the Si—H bonds absorb and remove the oxide layer. It is thus possible to suppress the collapse phenomenon and/or variation in the parasitic capacitance.

However, if the silicon composition ratio of the silicon oxide film 26 is increased, the drain current is varied in the continuous energization, as illustrated in FIGS. 4A and 5B. The inventors consider the following. Even if desorption of some H out of the Si—H bonds happens and Si is bonded to the oxide layer, there are still many Si—H bonds in the silicon nitride film 26. In the annealing process in the fabrication process, silicon dangling bonds are generated due to desorption of hydrogen in the Si—H bonds. The silicon dangling bonds have a deep energy level. When 2 DEG has a high electric field, as indicated by arrows 64, hot electrons are injected into the silicon nitride film 26 and the insulating film 30 from 2 DEG. Some of electrons 60 in the silicon nitride film 26 move into the insulating film 30 by hopping conduction at an energy level due to Si—Si bonds (an arrow 66), and are trapped therein (arrows 72). Some electros 60 are reflected on the surface (arrow 68). Some of the electros 60 in the silicon nitride film 26 are trapped at an energy level resulting from the silicon dangling bonds (arrows 62). The energy at the level resulting from the silicon dangling bonds is lower than the energy of the Si—Si bonds. Thus, the electrons 60 trapped in the silicon dangling bonds cannot move in the silicon nitride film 26. Therefore, as indicated by a broken line 74, the potential energy of the silicon nitride film 26 is higher. As a result, the potential energy of 2 DEG increases and the concentration of electronic carriers thereof decreases, whereby the drain current varies.

Through the above consideration, the inventors studied the following method. First, the desorption of H in the S—H bonds in the silicon-rich silicon nitride film 26 is caused. Next, an element that is to be bonded to the silicon dangling bonds is introduced. The introduced element is bonded to a silicon dangling bond. Preferably, the element has a chemical form having a large electron affinity and a low Gibbs free energy for bonding to Si. Further, it is preferable that the element has a relatively small ion radius for the movement in the silicon nitride film 26. Therefore, the element is preferably in any of group-V to group-VII of the periodic table and in any of the second through fourth periods. Further, since the deep level is not formed in the silicon nitride film 26, it is preferable that the element is bonded to Si and has a chemical form having a wide band gap. Exemplary elements that satisfy the above conditions are oxygen (O), nitrogen (N), fluorine (F), phosphorus (P), sulfur (S) and selenium (Se). Out of the elements described above, O, N and F are suitable for plasma processing.

As described above, in annealing in FIG. 1D, the desorption of H in the Si—H bonds is caused to generate the silicon dangling bonds. In plasma processing in FIG. 2A, O or the like is bonded to the silicon dangling bonds. Since the level due to the Si—O bonds is lowered, the electrons are not trapped. This is different from trapping at the level due to the silicon dangling bonds.

FIG. 6B relates to the first embodiment. Since there is no level resulting from the silicon dangling bonds in the silicon nitride film 26, the electrons injected into the silicon nitride film 26 conduct in the insulating film 30. Thus, the silicon nitride film 26 has only a small potential energy change and variations in the drain current are suppressed.

In order to examine whether the silicon dangling bonds in the silicon nitride film 26 are bonded to O or not, FTIR (Fourier Transform Infrared Spectroscopy) measurement was conducted. The following three samples were prepared. Sample A is a sample immediately after the silicon nitride film 26 is deposited on the GaN layer. Sample B is a sample obtained by exposing sample A to plasma processing with O without annealing. Sample C is a sample obtained by annealing sample A and thereafter exposing sample A to plasma processing with O. In samples A, B and C, the conditions for depositing the silicon nitride film 26 are the same as exemplary those previously described with reference to FIG. 1C, the conditions for annealing are exemplary those previously described with reference FIG. 1D, and the conditions for plasma are the same as exemplary those of the ICP method previously described with reference to FIG. 2A.

Figure 7:
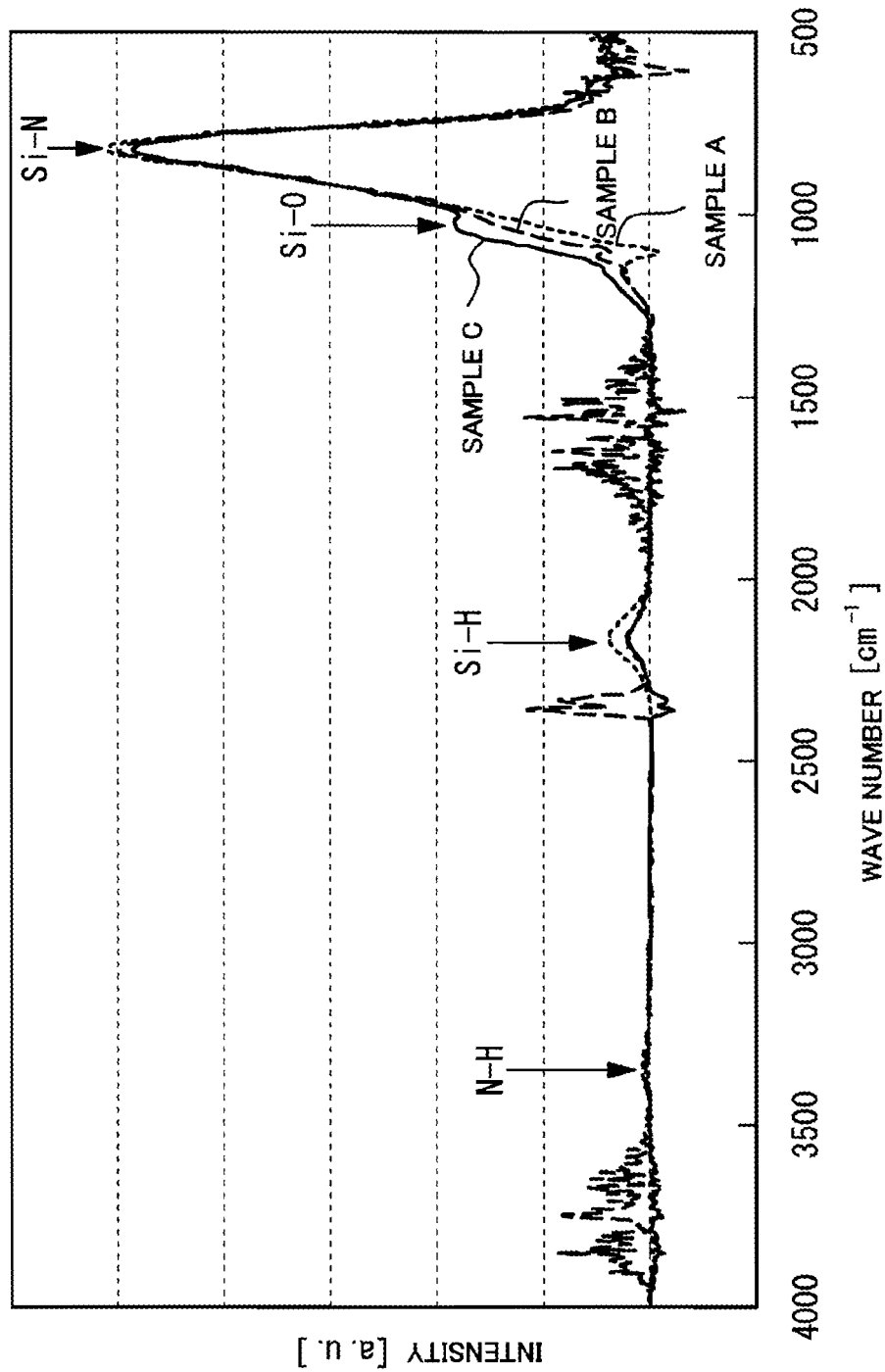
FIG. 7 is a spectrum diagram of an FTIR spectrum of each sample.

FIG. 7 is a diagram of an FTIR spectrum for each sample. The horizontal axis of FIG. 7 is the wave number and the vertical axis thereof is the intensity. A Si—N signal relates to stretching vibration of Si-N bonds and is approximately 840 $cm^{-1}$. A Si—O signal relates to stretching vibration Si—O and is approximately 1050 $cm^{-1}$. A Si—H signal relates to stretching vibration of Si—H bonds and is approximately 2150 $cm^{-1}$. A N—H signal relates to stretching vibration of N—H bonds and is approximate 3300 $cm^{-1}$.

The Si—N signal becomes smaller in the order of A, B and C. The Si—O signal becomes larger in the order of A, B and C. The Si—H signals of samples B and C are smaller than the Si—H signal of sample A. The N—H signals of samples A, B and C have little difference. From the above, it is seen that the Si—H bonds decrease and the Si—O bonds increase by the plasma processing. Some of the Si—N bonds change to the Si—O bonds. The Si—O bonds further increase by annealing.

Figure 8A:
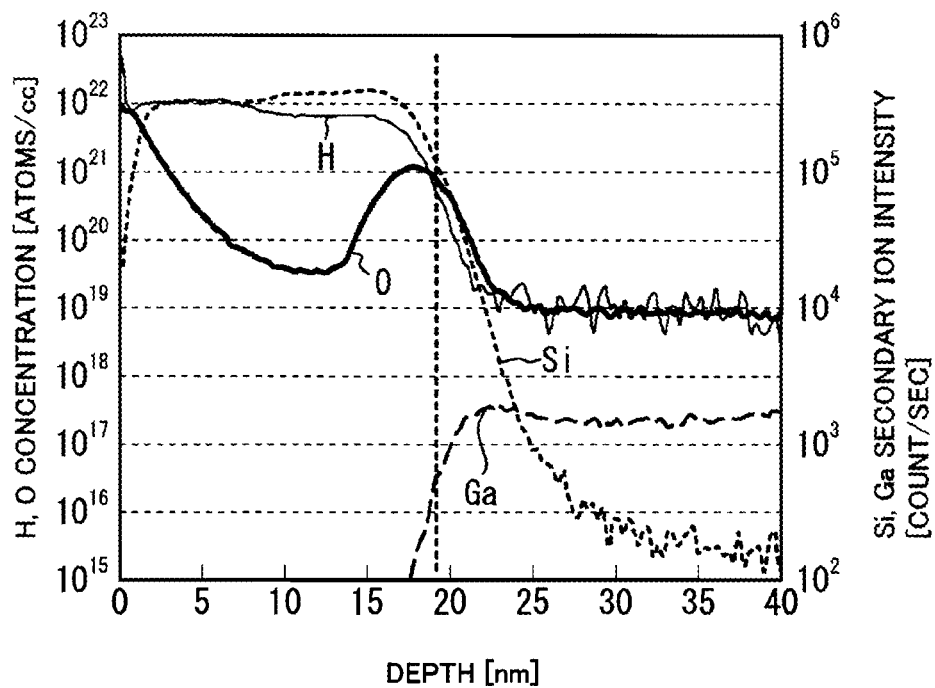
FIG. 8A is a diagram of the concentration and ion intensity of sample A associated with the depth.
Figure 8B:
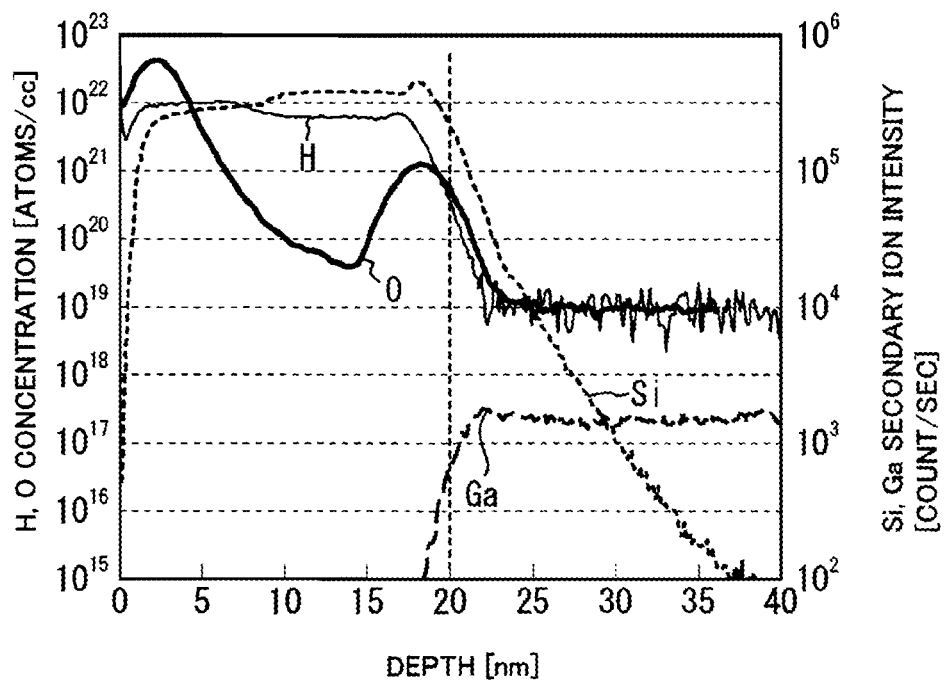
FIG. 8B is a diagram of the concentration and ion intensity of sample C associated with the depth.

The oxygen concentration in the depth direction of the silicon nitride film 26 was measured by using the SIMS (Secondary Ion Mass Spectrometry) method. FIG. 8A shows the concentration and the ion intensity of sample A in association with the depth, and FIG. 8B shows the concentration and the ion intensity of sample C in association with the depth. The depth corresponds to the depth from the surface of the silicon nitride film 26. The elements measured are H, O, Si and Ga. H and O are indicated by the concentration, and Si and Ga are indicated by the secondary ion intensity. A vertical dotted line corresponds to the interface between the silicon nitride film 26 and the GaN layer.

Referring to FIGS. 8A and 8B, in samples A and C, the oxygen concentration increases at the interface of the silicon nitride film 26 with the GaN layer (in a depth of around 15 nm to 20 nm). This indicates that oxygen of a gallium oxide layer formed on the surface of the GaN layer is removed by gettering due to excessive Si—H bonds in the silicon-rich silicon nitride oxide film 26. In the region shallower than a depth of 15 nm, it is considered that silicon dangling bonds resulting from desorption of H from Si—H remain.

As illustrated in FIG. 8B, in sample C, the oxygen concentration is higher than that of sample A in FIG. 8A in a region of a depth of 0 nm to less than 10 nm. It is considered that the silicon dangling bonds are covalently bonded to oxygen.

As described above, it is confirmed that the silicon dangling bonds in the silicon nitride film 26 are replaced with the Si—O covalent bonding pairs by the O plasma processing.

According to the first embodiment, as illustrated in FIG. 1C, the silicon nitride film 26 having a refractive index equal to or larger than 2.2 is deposited on the nitride semiconductor layer 20. As illustrated in FIG. 2A, the surface of the silicon nitride film 26 is exposed to plasma processing including oxygen. Thus, as illustrated in FIG. 5B, variations in the drain current are suppressed.

Since the silicon oxide film 26 is the silicon-rich film, the refractive index is preferably equal to or larger than 2.3 and is more preferably equal to or larger than 2.35. The refractive index is preferably equal to or smaller than a value at which the silicon-rich film 26 becomes amorphous. More specifically, the refractive index is preferably equal to or smaller than 2.85, and is more preferably equal to or smaller than 2.6. A silicon-rich film is available when the composition ratio Si/N of the silicon nitride film 26 (atom ratio) is larger than 0.75. The composition ratio Si/N is preferably equal to or larger than 0.8, and is more particularly equal to or larger than 0.9. The composition ratio Si/N is preferably equal to or smaller than 1.2.

In the plasma processing, the surface of the silicon nitride film 26 is exposed to plasma including at least one of O, N and F. The apparatus used for the plasma processing may be an apparatus other than the CCP apparatus and the ICP apparatus, and may be an ECR (Electron Cyclotron Resonance) apparatus. The conditions for plasma processing may be selected appropriately so that O, N or F does not reach the nitride semiconductor layer 20, and the Si—H bonds of the silicon nitride film 26 remain.

As illustrated in FIG. 1D, after the step of depositing the silicon nitride film 26 and before the step of plasma processing, the silicon nitride film 26 is annealed at a temperature that is at least 50° C. higher than the temperature at which the silicon nitride film 26 is deposited. This annealing causes desorption of H of Si—H. It is to be noted that as illustrated in FIG. 7, the Si—H bonds may be replaced with the Si—O bonds without annealing.

Figure 9:
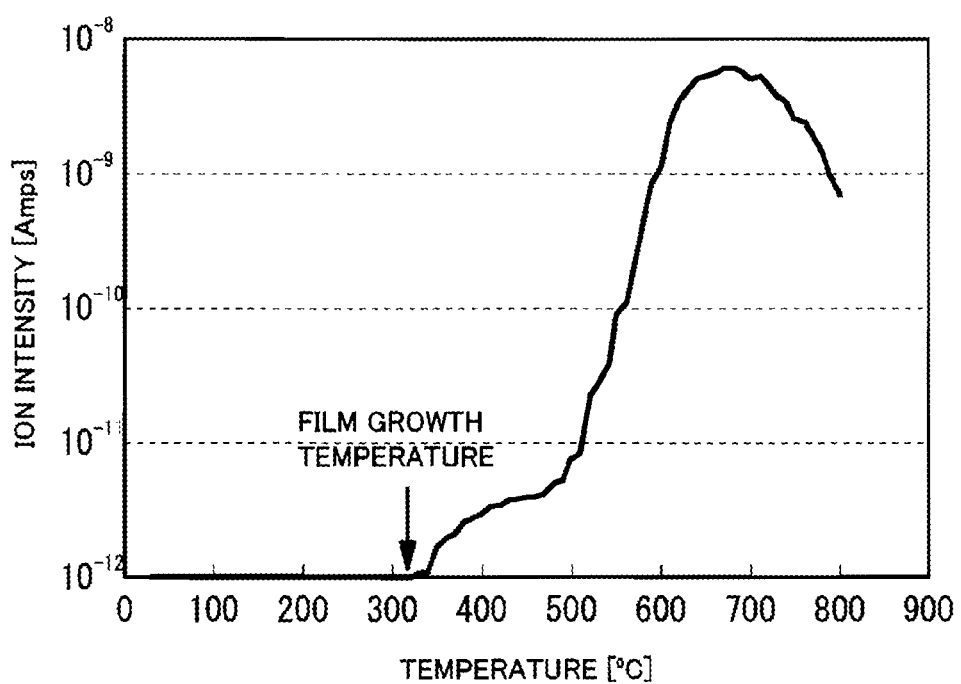
FIG. 9 is a diagram of a hydrogen ion intensity of a silicon nitride film associated with the temperature.

By a TDS (Thermal Desorption Spectrometry) method, a relation between annealing and desorption of H was examined after the silicon nitride film 26 was deposited. FIG. 9 is a diagram of the hydrogen ion intensity associated with the temperature of the silicon nitride film. Referring to FIG. 9, the temperature at which the film is deposited is 300° C. As the annealing temperature rises, the desorption of H occurs more greatly. At about 700° C., the desorption of H is saturated. The desorption of H starts at a film depositing temperature of +50° C. Thus, in order to cause the desorption of H, it is preferable that the annealing temperature in FIG. 1D is at least 50° C. higher than the temperature at which the silicon nitride film 26 is deposited. The annealing temperature is more preferably at least 100° C. higher than the film growth temperature, and is much more preferably at least 200° C. higher than the film growth temperature. Since the desorption of H is saturated, the annealing temperature is preferably at most 400° C. lower than the film growth temperature.

Figure 10A:
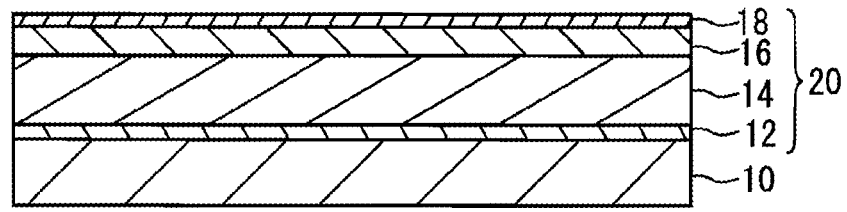
FIGS. 10A through 10D are cross-sectional views that illustrate a method for fabricating a semiconductor device in accordance with a variation of the first embodiment.
Figure 10B:
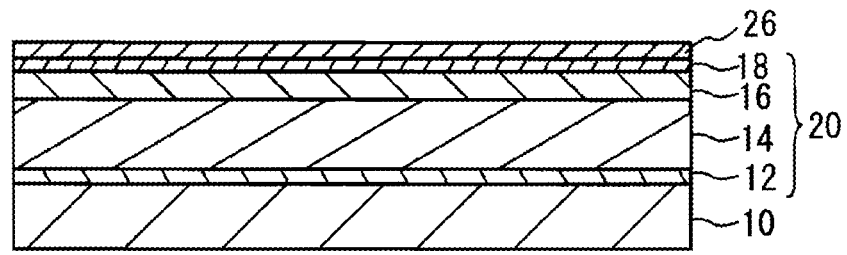
Figure 10C:
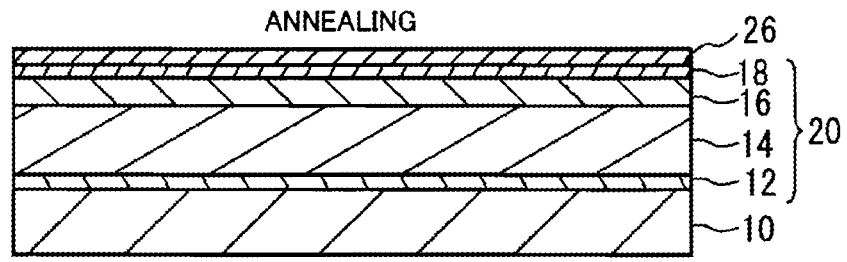
Figure 10D:
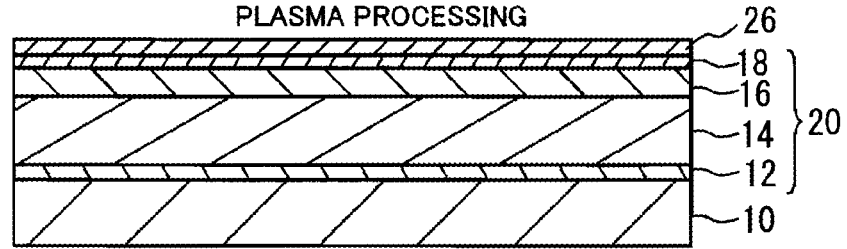

A description is now given of a variation of the first embodiment. FIGS. 10A through 10D, 11A through 11C, 12A and 12B are cross-sectional views that illustrate a method for fabricating a semiconductor device in accordance with a variation of the first embodiment. Referring to FIG. 10A, the nitride semiconductor layer 20 is grown on the substrate as in the case of FIG. 1A. Referring to FIG. 10B, the silicon nitride film 26 that has a refractive index equal to or larger than 2.2 is deposited on the nitride semiconductor layer 20. The method for depositing the silicon nitride film 26 is the same as that illustrated in FIG. 1C. Referring to FIG. 10C, the silicon nitride film 26 is annealed. The conditions for annealing are the same as those illustrated in FIG. 1D. Referring to FIG. 10D, the surface of the silicon nitride film 26 is exposed to plasma including at least one of O, N and F. The conditions for plasma processing are the same as those illustrated in FIG. 2A.

Figure 11A:
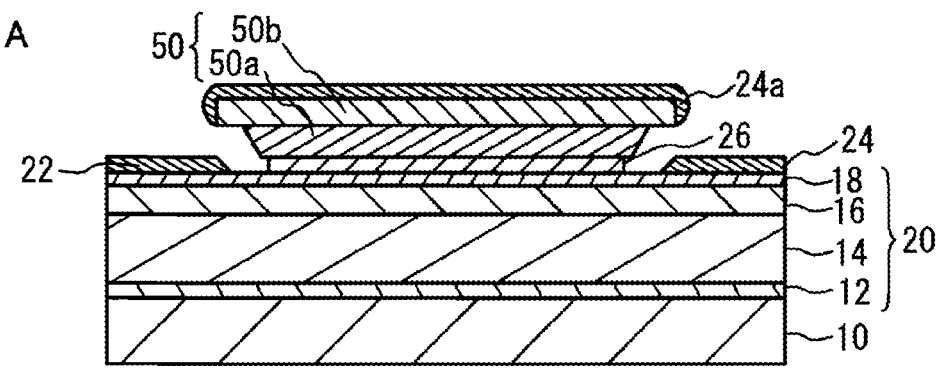
FIGS. 11A through 11C are cross-sectional views of steps that follow those in FIGS. 10A through 10D.
Figure 11B:
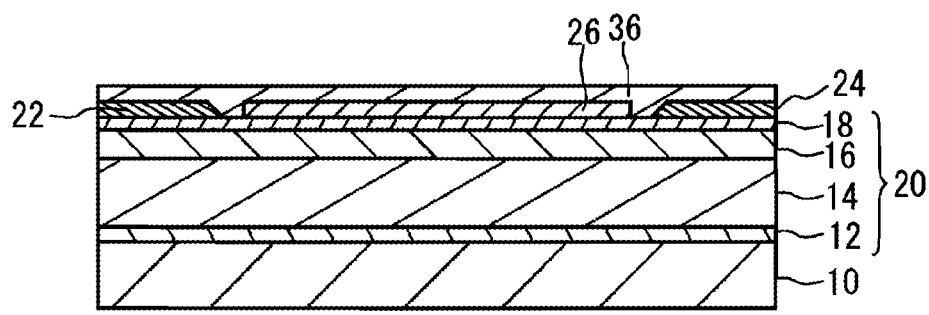
Figure 11C:
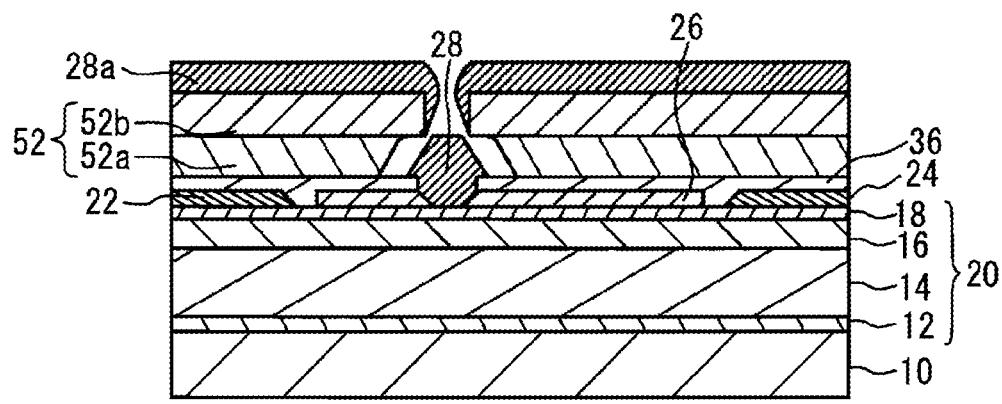

Referring to FIG. 11A, the photoresist 50 is patterned as in the case of FIG. 1B. Openings are formed in the silicon nitride film 26, and the source electrode 22 and the drain electrode 24 are formed in the openings. The conditions for forming the source electrode 22 and the drain electrode 24 are the same as those in FIG. 1B. Referring to FIG. 11B, an insulating film 36 is formed on the source electrode 22, the drain electrode 24 and the silicon nitride film 26. The insulating film 36 is, for example, a silicon nitride film that has a thickness of 50 nm and a refractive index of smaller than 2.2 and is similar to the stoichiometric composition. Referring to FIG. 11C, the gate electrode 28 is formed as in the case of FIG. 2B.

Figure 12A:
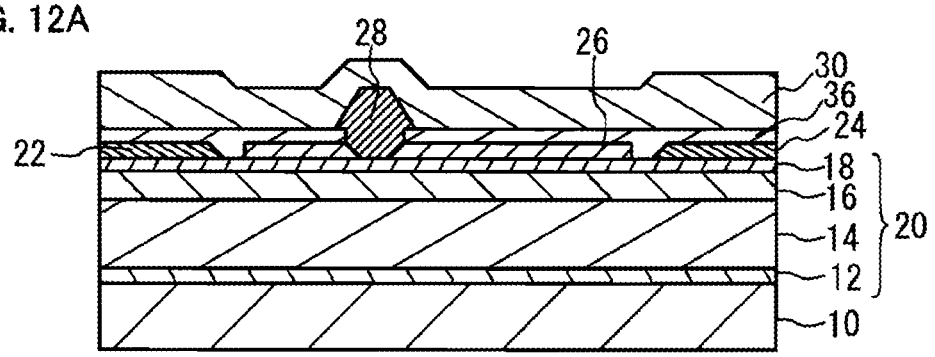
FIGS. 12A and 12B are cross-sectional views of steps that follow those in FIGS. 11A through 11C.
Figure 12B:
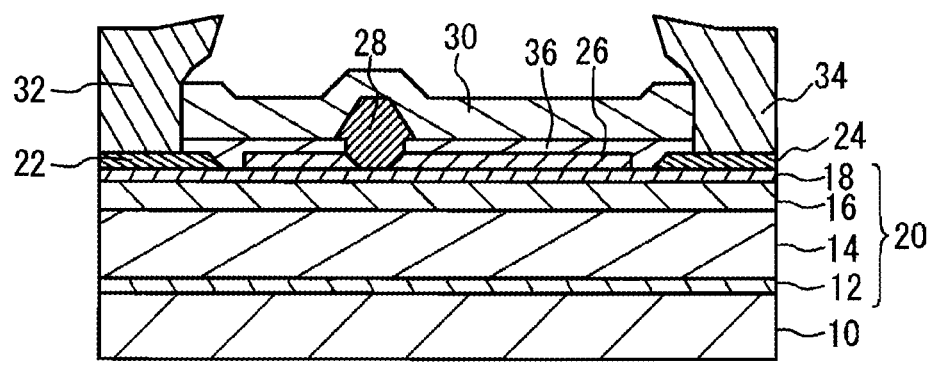

Referring to FIG. 12A, the insulating film 30 is formed as in the case of FIG. 2C. Referring to FIG. 12B, the source interconnection line 32 and the drain interconnection line 34 are formed as in the case of FIG. 2D.

As in the case of the first embodiment, the process of forming the source electrode 22 and the drain electrode 24 may be carried out before the plasma processing. As in the case of the variation of the first embodiment, the process of forming the source electrode 22 and the drain electrode 24 may be carried out after the plasma processing.

Second Embodiment

Figure 13A:
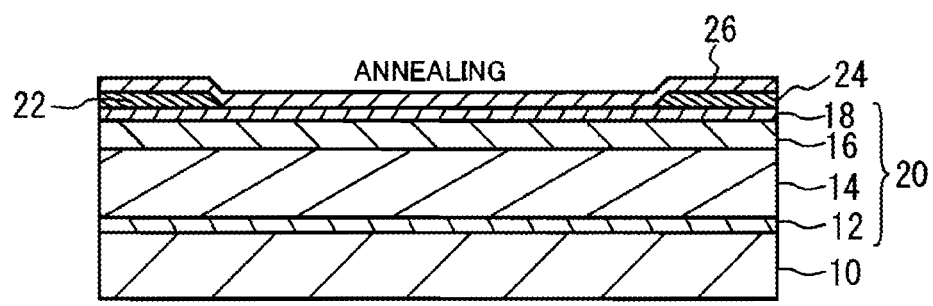
FIGS. 13A and 13B are cross-sectional views that illustrate a method for fabricating a semiconductor device in accordance with a second embodiment.
Figure 13B:
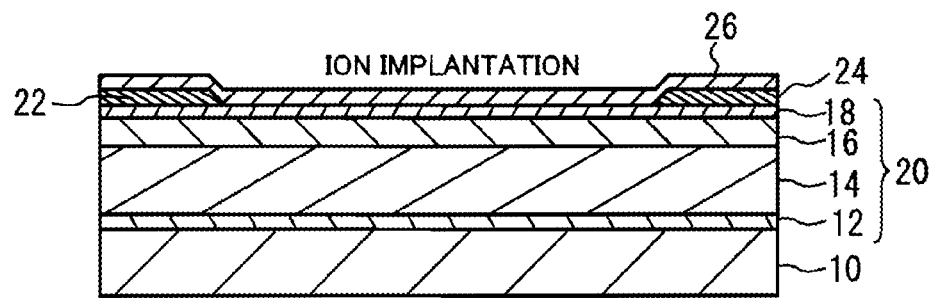

A second embodiment is an example in which an element is implanted in the silicon nitride film by ion implantation. FIGS. 13A and 13B are cross-sectional views of a method for fabricating a semiconductor device in accordance with the second embodiment. Referring to FIG. 13A, the steps of FIGS. 1A through 1C are carried out. The silicon nitride film 26 is annealed. The annealing conditions are the same as those described with reference to FIG. 1D. Referring to FIG. 13B, at least one of O, N, F, P, S and Se is ion-implanted. Exemplary conditions for the ion implantation have an implantation energy of 0.5 keV, and a dose of $5 \times 10^{12}$ cm$^{-2}$.

According to the second embodiment, the ion implantation is used instead of the plasma processing in order to introduce O, N, F, P, S or Se into the silicon nitride film 26. Therefore, the second embodiment is capable of suppressing variations in the drain current as in the case of the first embodiment. The conditions for the ion implantation may be appropriately selected so that ions are implanted in the region in which the Si—H bonds of the silicon nitride film 26 remain.

The annealing process may be carried out after the ion implantation process. The annealing temperature is selected so that the implanted ions are bonded to Si. The process of forming the source electrode 22 and the drain electrode 24 may be carried out before the ion implantation process. As in the case of the variation of the first embodiment, the process of forming the source electrode 22 and the drain electrode 24 may be carried out after the ion implantation process. The annealing process illustrated in FIG. 1D may be omitted.

Third Embodiment

Figure 14A:
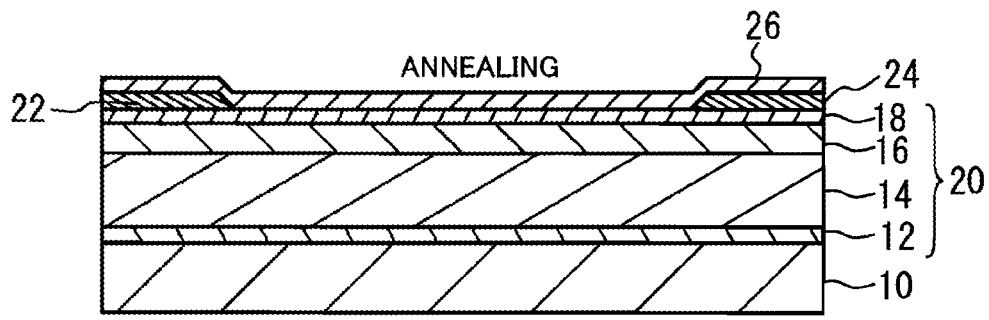
FIGS. 14A through 14C are cross-sectional views that illustrate a method for fabricating a semiconductor device in accordance with a third embodiment.
Figure 14B:
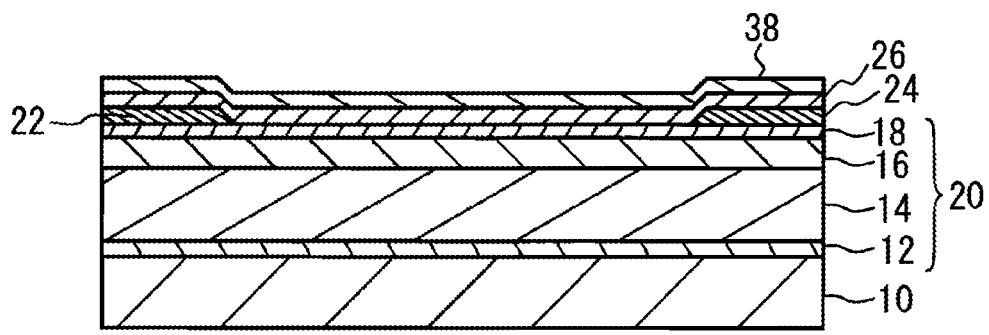
Figure 14C:
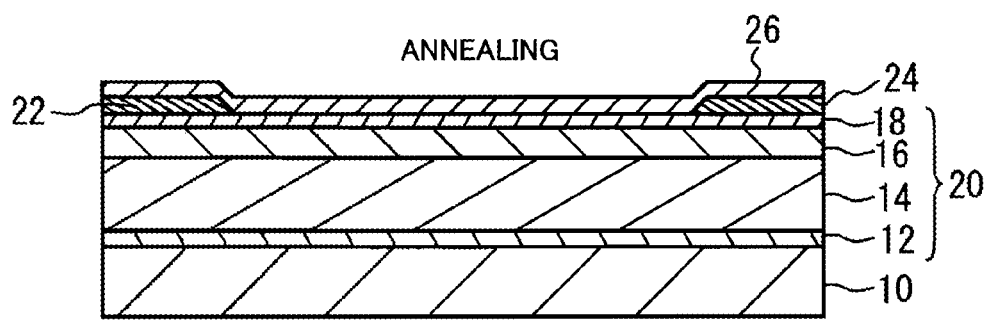

A third embodiment is an example in which an element is introduced into the silicon nitride film by diffusion. FIGS. 14A through 14C are cross-sectional views that illustrate a method for fabricating a semiconductor device in accordance with the third embodiment. Referring to FIG. 14A, the steps of FIGS. 1A through 1C are carried out. The silicon nitride film 26 is annealed. The annealing conditions are the same as those described with reference to FIG. 1D. Referring to FIG.

14B, a Se film 38 is formed on the silicon nitride film 26. For example, the Se film 38 has a thickness of 3 nm, and is formed by sputtering. Referring to FIG. 14C, Se in the Se film 38 is thermally diffused into the silicon nitride film 26. The annealing temperature is 400° C., for example.

According to the third embodiment, the diffusion process replaced with the plasma processing makes it possible to introduce Se into the silicon nitride film 26. Thus, as in the case of the first embodiment, variations in the drain current can be suppressed. The diffusion conditions may be selected appropriately so that Se does not reach the silicon nitride layer 20 and the Si—H bonds in the silicon nitride film 26 remain.

The process of forming the source electrode 22 and the drain electrode 24 may be carried out before the diffusion process. As in the case of the variation of the first embodiment, the process of forming the source electrode 22 and the drain electrode 24 may be carried out after the diffusion process. The annealing process illustrated in FIG. 1D may be omitted.

As in the case of the first through third embodiments, at least one of O, N, F, P, S and Se is introduced into the silicon nitride film 26. The silicon nitride film 26 into which at least one of the elements has been introduced remains on the nitride semiconductor layer 20 after the process of fabricating the semiconductor device is completed. That is, the silicon nitride film 26 into which at least one of the elements has been introduced is not removed. It is thus possible to suppress variations in the drain current.

The process of introducing at least one of the elements may be carried out by exposing the silicon nitride film 26 to plasma including the element or elements to be introduced as in the case of the first embodiment. The element introduction process may be carried out by ion implantation as in the case of the second embodiment. The element introduction process may be carried out by thermal diffusion.

In order to cause the desorption of H in Si—H, it is preferable to anneal the nitride semiconductor layer 20 with which the silicon nitride film 26 is provided before at least one of the elements is introduced. It is preferable that the annealing temperature is 50° C. higher than the deposit temperature of the silicon nitride film 26.

As in the case of the variation of the first embodiment, the electrodes that have the ohmic contacts with the nitride semiconductor layer 20 are formed before or after the element introduction process.

The silicon nitride film 26 is provided in the region between the gate electrode 28 and the drain electrode 24 of the field effect transistor. It is thus possible to suppress variations in the drain current.

As illustrated in FIG. 2C, the protection film (insulating film 30) of silicon nitride having a refractive index of less than 2.2 is formed on the silicon nitride film 26.

In order to suppress variations in the drain current, it is preferable that the silicon nitride film 26 is formed in contact with the surface of the nitride semiconductor layer.

The element or elements are preferably introduced into the whole surface of the silicon nitride film 26.

In the first through third embodiments, the nitride semiconductor layer 20 may include at least one layer made of GaN, InN, AlN, AlGaN, InGaN, AlInN or AlInGaN.

The present invention is not limited to the specifically described embodiments and variations, but may include other embodiments and variations without departing from the scope of the claimed invention.

What is claimed is:

1. A method for fabricating a semiconductor device comprising:
    forming a source electrode and a drain electrode of a field effect transistor in contact with an upper surface of a nitride semiconductor layer;
    forming a silicon nitride film having a refractive index equal to or larger than 2.2 on contact with the upper surface of the nitride semiconductor layer;
    annealing the nitride semiconductor layer after the silicon nitride film is formed;
    introducing at least one of elements that are oxygen, nitrogen and fluorine into the silicon nitride film by a plasma process to the silicon nitride film including the at least one of elements after the silicon nitride film is annealed; and
    forming a gate electrode of the field effect transistor in contact with the upper surface of the nitride semiconductor layer,
    the silicon nitride film including the at least one of elements remaining in the nitride semiconductor layer.

2. The method according to claim 1, wherein a temperature of the annealing is at least 50 ° C. higher than a deposit temperature of the silicon nitride film.

3. The method according to claim 1, wherein the silicon nitride film is provided in a region between a gate electrode and a drain electrode of a field effect transistor.

4. The method according to claim 1, further comprising forming a protection film of silicon nitride having a refractive index equal to or smaller than 2.2 on the silicon nitride film.

5. The method according to claim 1, wherein the introducing of the at least one of elements introduces the at least one of elements into a whole surface of the silicon nitride film.

6. The method according to claim 1, wherein the process of exposing the silicon nitride film to plasma includes one of CCP (Capacitively Coupled Plasma), ICP (Inductively Coupled Plasma) and ECR (Electron Cyclotron Resonance).

7. The method according to claim 1, wherein the process of thermally diffusing the at least one of elements into the silicon nitride film includes depositing the at least one of elements on the silicon nitride film and anneals the at least one of elements and the silicon nitride film.

8. The method according to claim 1, wherein the source electrode and the drain electrode are apart from the silicon nitride film.

9. The method according to claim 1, wherein the nitride semiconductor layer is any of GaN, AlGaN and AlInN.

* * * * *